United States Patent
Hioka

(10) Patent No.: US 10,418,114 B2
(45) Date of Patent: *Sep. 17, 2019

(54) SEMICONDUCTOR MEMORY DEVICE

(71) Applicant: Toshiba Memory Corporation, Tokyo (JP)

(72) Inventor: Takeshi Hioka, Machida Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/131,670

(22) Filed: Sep. 14, 2018

(65) Prior Publication Data

US 2019/0027225 A1 Jan. 24, 2019

Related U.S. Application Data

(63) Continuation of application No. 15/693,407, filed on Aug. 31, 2017, now Pat. No. 10,090,056.

(30) Foreign Application Priority Data

Jan. 19, 2017 (JP) ................. 2017-007572

(51) Int. Cl.
*G11C 11/34* (2006.01)
*G11C 16/30* (2006.01)
*G11C 16/04* (2006.01)
*G11C 16/24* (2006.01)
*G11C 16/26* (2006.01)

(52) U.S. Cl.
CPC .......... *G11C 16/30* (2013.01); *G11C 16/0483* (2013.01); *G11C 16/24* (2013.01); *G11C 16/26* (2013.01)

(58) Field of Classification Search
CPC ......... G11C 16/10; G11C 16/30; G11C 16/12; G11C 16/0482; G11C 16/24
USPC .......................... 365/185.18, 189.14, 189.15
See application file for complete search history.

(56) References Cited

U.S. PATENT DOCUMENTS

| 7,161,833 | B2 | 1/2007 | Hemink |
| 7,366,018 | B2 | 4/2008 | Shibata |
| 7,936,004 | B2 | 5/2011 | Kito et al. |
| 8,670,285 | B2 | 3/2014 | Dong et al. |
| 8,917,557 | B2 | 12/2014 | Sakaguchi et al. |
| 9,361,993 | B1 | 6/2016 | Chen et al. |
| 10,090,056 | B2 * | 10/2018 | Hioka .................... G11C 16/30 |
| 2011/0075481 | A1 | 3/2011 | Fukuzumi et al. |

* cited by examiner

*Primary Examiner* — Son T Dinh
(74) *Attorney, Agent, or Firm* — Kim & Stewart LLP

(57) ABSTRACT

A semiconductor memory device includes first and second memory cell transistors between first and second select transistors, third and fourth memory cell transistors between third and fourth select transistors, a first word line for first and third memory cell transistors, a second word line for second and fourth memory cell transistors, first to fourth selection gate lines respectively for first through fourth select transistors, a bit line, and a source line. During a read operation, while a voltage applied to the second word line is boosted, voltages applied to the first word line and the third and fourth selection gate line are also boosted, after which the voltage applied to the first word line is lowered, and the third and fourth selection gate lines are discharged. After the time the third and fourth selection gate lines are discharged, voltages applied to the bit line and the source line are boosted.

16 Claims, 9 Drawing Sheets

SEMICONDUCTOR MEMORY DEVICE

CROSS-REFERENCE TO RELATED APPLICATIONS

This application is a continuation of U.S. patent application Ser. No. 15/693,407, filed on Aug. 31, 2017, which is based upon and claims the benefit of priority from Japanese Patent Application No. 2017-007572, filed on Jan. 19, 2017, the entire contents of each of which are incorporated herein by reference.

FIELD

Embodiments described herein relate generally to a semiconductor memory device.

BACKGROUND

A NAND-type flash memory is known as a semiconductor memory device.

DETAILED DESCRIPTION

Figure 1:
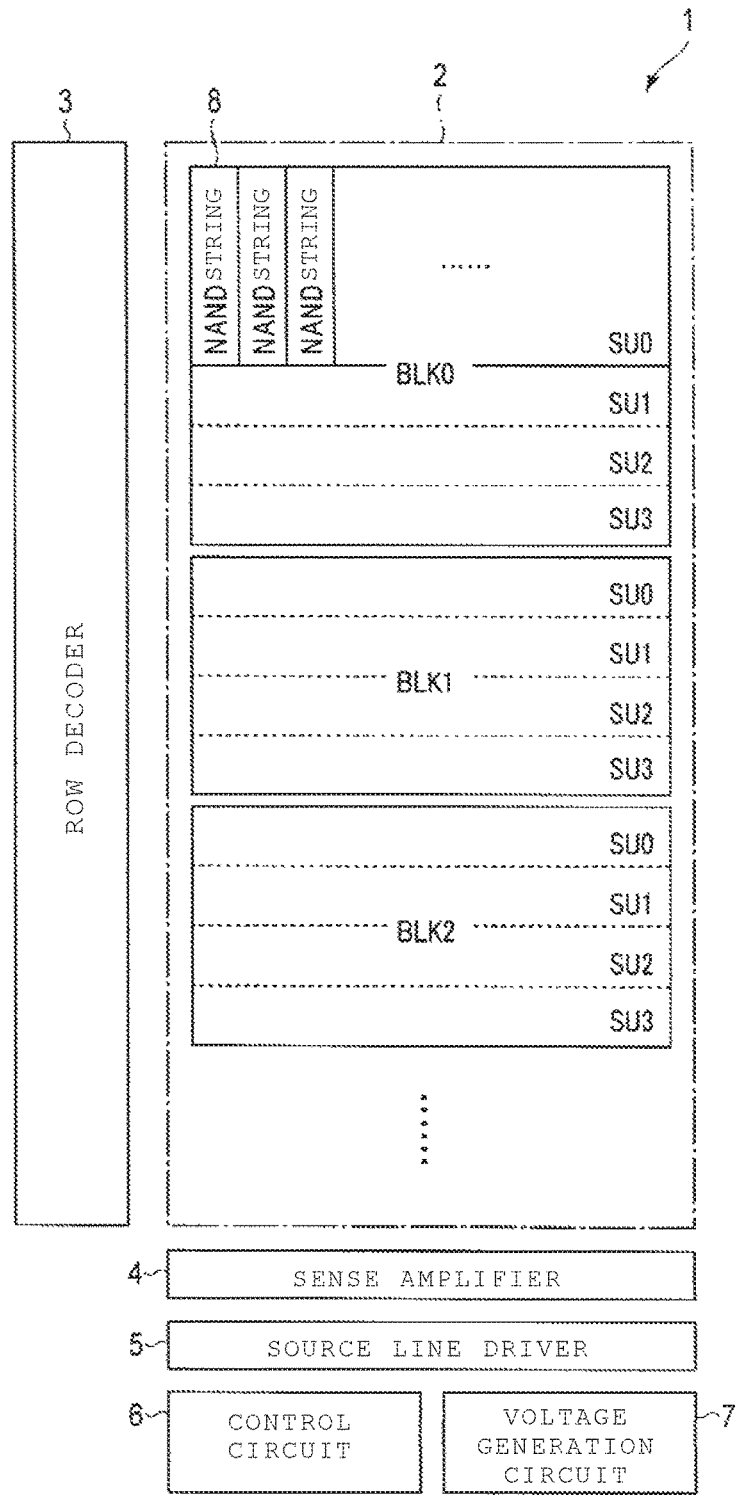
FIG. 1 is a block diagram of a semiconductor memory device according to a first embodiment.

Embodiments provide a semiconductor memory device capable of improving processing capacity.

In general, according to one embodiment, a semiconductor memory device includes a first memory string including first and second select transistors and first and second memory cell transistors connected between the first and second select transistors, a second memory string including third and fourth select transistors and third and fourth memory cell transistors connected between the third and fourth select transistors, a first word line connected to gates of the first and third memory cell transistors, a second word line connected to gates of the second and fourth memory cell transistors, first to fourth selection gate lines respectively connected to gates of the first to fourth select transistors, a bit line connected to the first and third select transistors, and a source line connected to the second and fourth select transistors. During a read operation performed on the first memory cell transistor, the second word line is boosted from a first voltage to a second voltage at a constant rate over a first time interval starting at a first point in time, and the first and second selection gate lines are boosted from the first voltage to a third voltage, which is lower than the second voltage, at a constant rate over a second time interval, which is shorter than the first time interval, starting at the first point in time. In addition, the first word line is boosted from the first voltage to a fourth voltage, which is lower than the third voltage, at a constant rate over a third time interval, which is shorter than the second time interval, starting at the first point in time, and then a fifth voltage lower than the fourth voltage is applied to the first word line. Further, the third and fourth selection gate lines are boosted from the first voltage to the fourth voltage at a constant rate over the third time interval starting at the first point in time, and then the first voltage is applied to the third and fourth selection gate lines. The bit line and the source line are maintained at a sixth voltage, which is lower than the fifth voltage, during the third time interval, and then, after the end of the third time interval, the bit line and the source line are boosted from the sixth voltage to a seventh voltage.

Hereinafter, embodiments are described with reference to the drawings. In this description, portions which are used in common are assigned the respective same reference characters in all of the figures.

1. First Embodiment

A semiconductor memory device according to a first embodiment is described. In the following description, a three-dimensionally stacked NAND-type flash memory, in which memory cell transistors are three-dimensionally stacked in layers on a semiconductor substrate, is taken as an example of the semiconductor memory device.

1.1 Configuration 1.1.1 Overall Configuration of Semiconductor Memory Device

First, the entire configuration of the semiconductor memory device according to the present embodiment is described with reference to FIG. 1.

As illustrated in FIG. 1, the NAND-type flash memory 1 includes a memory cell array 2, a row decoder 3, a sense amplifier 4, a source line driver 5, a control circuit 6, and a voltage generation circuit 7.

The memory cell array 2 includes a plurality of blocks BLK (BLK0, BLK1, BLK2, . . . ) including non-volatile memory cell transistors associated with rows and columns. Each block BLK includes, for example, four string units SU (SU0 to SU3). Then, each string unit SU includes a plurality of NAND strings 8. The number of blocks included in the memory cell array 2 and the number of string units included in each block can be any number. Details of the memory cell array 2 are described below.

The row decoder 3 decodes a row address, selects any one of the blocks BLK based on a result of the decoding, and further selects any one of the string units SU. Then, the row decoder 3 outputs a required voltage to the selected block BLK. The row address is supplied from, for example, an external controller (not illustrated) which controls the NAND-type flash memory 1.

The sense amplifier 4 senses data read from the memory cell array 2 at the time of a read operation. Then, the sense amplifier 4 outputs the read data to the external controller. The sense amplifier 4 writes write data received from the external controller into the memory cell array 2 at the time of a write operation for data.

The source line driver 5 applies required voltages to a source line at the time of write, read, and erase operations.

The control circuit 6 controls the operation of the entire NAND-type flash memory 1.

The voltage generation circuit 7 generates voltages required for write, read, and erase operations, and applies the generated voltages to the row decoder 3, the sense amplifier 4, and the source line driver 5. The row decoder 3, the sense amplifier 4, and the source line driver 5 apply voltages supplied from the voltage generation circuit 7 to the memory cell transistors.

1.1.2 Configuration of Memory Cell Array

Next, a configuration of the memory cell array 2 is described with reference to FIG. 2. While the example illustrated in FIG. 2 indicates the block BLK0, the other blocks BLK have the same configuration.

Figure 2:
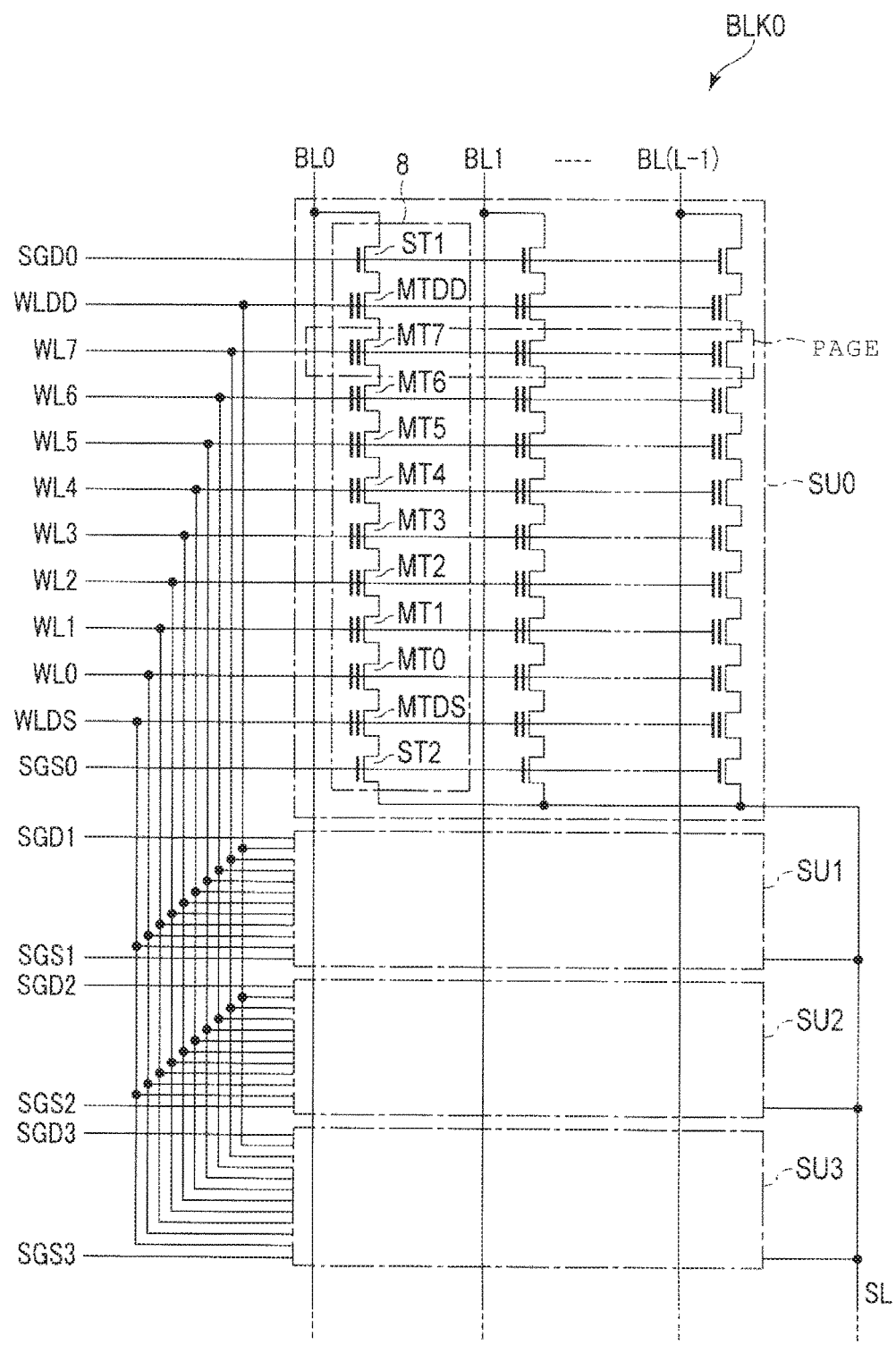
FIG. 2 is a circuit diagram of a memory cell array included in the semiconductor memory device according to the first embodiment.

As illustrated in FIG. 2, the block BLK0 includes, for example, four string units SU. Then, each string unit SU includes a plurality of NAND strings 8. Each NAND string 8 includes, for example, eight memory cell transistors MT0 to MT7, two dummy memory cell transistors MTDD and MTDS, and two select transistors ST1 and ST2. Hereinafter, in a case where no specific distinction is required, each of the memory cell transistors MT0 to MT7 is referred to as a "memory cell transistor MT". Moreover, in a case where no specific distinction is required, each of the dummy memory cell transistors MTDD and MTDS is referred to as a "dummy memory cell transistor MTD". Each of the memory cell transistor MT and the dummy memory cell transistor MTD includes a control gate and a charge storage layer, and stores data in a non-volatile manner.

Furthermore, each of the memory cell transistor MT and the dummy memory cell transistor MTD can be of the MONOS type, in which an insulating film is used as the charge storage layer, or can be of the FG type, in which a conductive layer is used as the charge storage layer. Hereinafter, in the description of the present embodiment, the MONOS type is taken as an example. The number of memory cell transistors MT is not limited to 8, but can be, for example, 16, 32, 64, 128, or any other number. Moreover, the number of dummy memory cell transistors MTD can be any number; in fact, the dummy memory cell transistor MTD can be omitted. Furthermore, the number of select transistors ST1 and ST2 can be any natural number, i.e., one or more Then, the memory cell transistors MT and the dummy memory cell transistors MTD are connected in series between the source of the select transistor ST1 and the drain of the select transistor ST2. More specifically, the dummy memory cell transistor MTDS, the memory cell transistors MT0 to MT7, and the dummy memory cell transistor MTDD are connected in series in their current pathway. Then, the drain of the dummy memory cell transistor MTDD is connected to the source of the select transistor ST1, and the source of the dummy memory cell transistor MTDS is connected to the drain of the select transistor ST2.

The gates of the select transistors ST1 in the respective string units SU0 to SU3 are respectively connected to selection gate lines SGD0 to SGD3. Similarly, the gates of the select transistors ST2 in the respective string units SU0 to SU3 are respectively connected to selection gate lines SGS0 to SGS3. In one embodiment, the gates of the select transistors ST2 in the respective string units SU0 to SU3 share a common wiring layer, e.g., wiring layer 14 shown in FIG. 3. Hereinafter, in a case where no specific distinction is required, each of the selection gate lines SGD0 to SGD3 is referred to as a "selection gate line SGD". In a case where no specific distinction is required, each of the selection gate lines SGS0 to SGS3 is referred to as a "selection gate line SGS". Additionally, in a case where no specific distinction is required, each of the selection gate lines SGD and SGS is referred to as a "selection gate line SG". Furthermore, the selection gate lines SGS0 to SGS3 of the respective string units SU can be connected in common.

The control gates of the memory cell transistors MT0 to MT7 included in each block BLK are respectively connected to word lines WL0 to WL7 in common. Similarly, the control gates of the dummy memory cell transistors MTDD and MTDS included in each clock BLK are respectively connected to dummy word lines WLDD and WLDS in common. Hereinafter, in a case where no specific distinction is required, each of the word lines WL0 to WL7 is referred to as a "word line WL. Moreover, in a case where no specific distinction is required, each of the dummy word lines WLDD and WLDS is referred to as a "dummy word line WLD".

The drains of the select transistors ST1 of the respective NAND strings 8 included in the string unit SU are respectively connected to different bit lines BL0 to BL(L−1) (L being a natural number of 2 or more). Hereinafter, in a case where no specific distinction is required, each of the bit lines BL0 to BL(L−1) is referred to as a "bit line BL". Moreover, each bit line BL connects one NAND string 8 included in each string unit SU across a plurality of blocks BLK in common. Furthermore, the sources of a plurality of select transistors ST2 are connected to a source line SL in common.

In other words, the string unit SU is an aggregation of NAND strings 8 which are connected to respective different bit lines BL and are connected to the same selection gate line SGD. Moreover, the block BLK is an aggregation of a plurality of string units SU respectively connected to the word lines WL in common. Then, the memory cell array 2 is an aggregation of a plurality of blocks BLK respectively connected to the bit lines BL in common.

Erasing data can be performed in units of a block BLK or in units of a portion smaller than the block BLK. A method for erasing is described in, for example, U.S. patent application Ser. No. 13/235,389 filed Sep. 18, 2011, entitled "NONVOLATILE SEMICONDUCTOR MEMORY DEVICE," U.S. patent application Ser. No. 12/694,690 filed Jan. 27, 2010, entitled "NON-VOLATILE SEMICONDUCTOR STORAGE DEVICE," and U.S. patent application Ser. No. 13/483,610 filed May 30, 2012, entitled "NONVOLATILE SEMICONDUCTOR MEMORY DEVICE AND DATA ERASE METHOD THEREOF." The entire contents of these patent applications are incorporated in the present specification by reference.

Furthermore, the memory cell array 2 can have a different configuration, e.g., as described in U.S. patent application Ser. No. 12/407,403 filed Mar. 19, 2009, entitled "THREE DIMENSIONAL STACKED NONVOLATILE SEMICONDUCTOR MEMORY," U.S. patent application Ser. No. 12/406,524 filed Mar. 18, 2009, entitled "THREE DIMENSIONAL STACKED NONVOLATILE SEMICONDUC- TOR MEMORY," U.S. patent application Ser. No. 12/679,991 filed Mar. 25, 2010, entitled "NON-VOLATILE SEMICONDUCTOR STORAGE DEVICE AND METHOD OF MANUFACTURING THE SAME," and U.S. patent application Ser. No. 12/532,030 filed Mar. 23, 2009, entitled "SEMICONDUCTOR MEMORY AND METHOD FOR MANUFACTURING SAME." The entire contents of these patent applications are incorporated in the present specification by reference.

1.1.3 Cross-Section Configuration of Memory Cell Array

Next, a cross-section configuration of the memory cell array 2 is described with reference to FIG. 3. The example illustrated in FIG. 3 indicates the cross-section of the string units SU0 and SU1, and the same also applies to the configuration of the string units SU2 and SU3. Furthermore, in FIG. 3, an interlayer insulating film is omitted from illustration.

Figure 3:
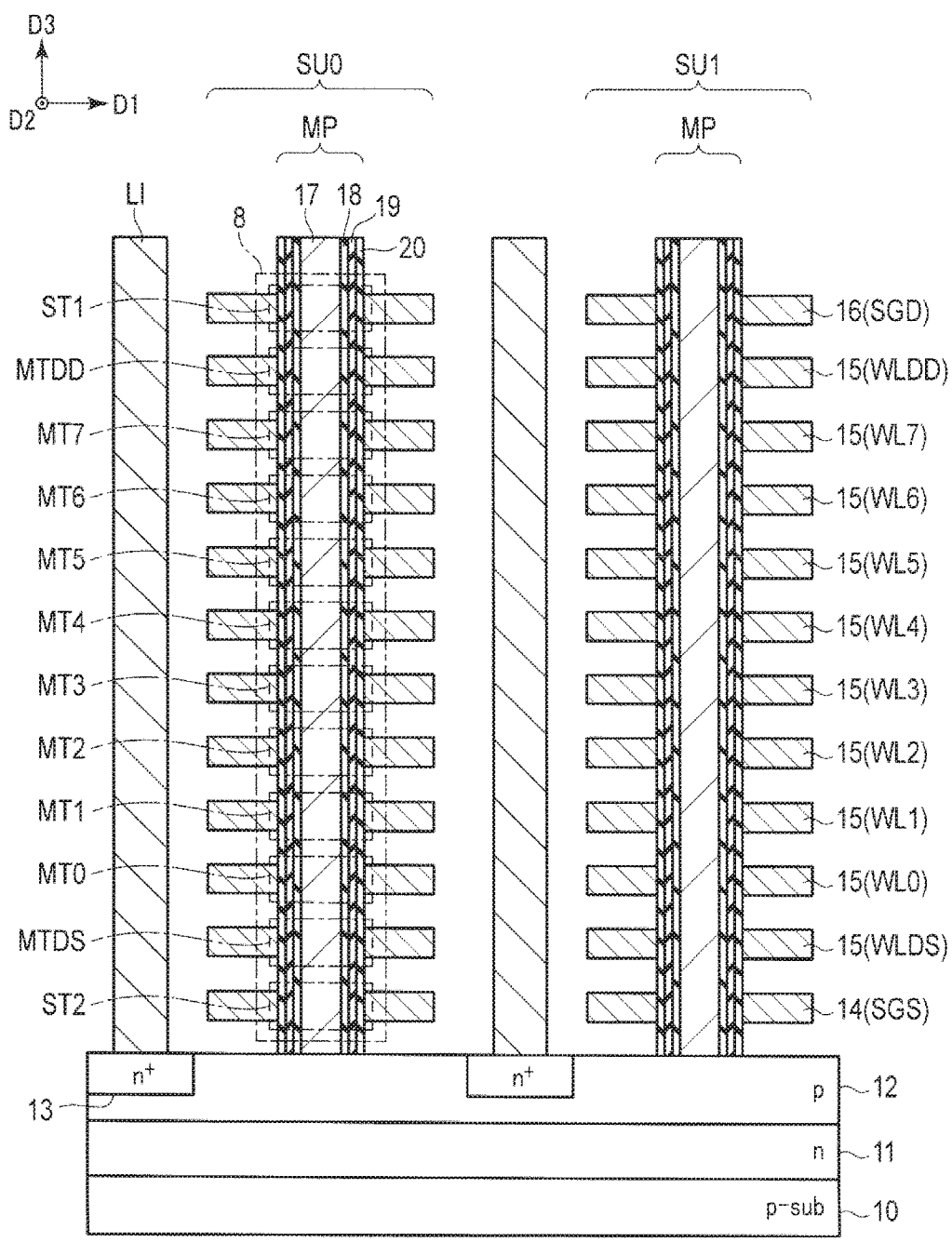
FIG. 3 is a sectional view of the memory cell array included in the semiconductor memory device according to the first embodiment.

As illustrated in FIG. 3, a plurality of source line contacts LI is provided along a first direction D1 parallel to the semiconductor substrate 10, and one string unit SU is located between two source line contacts LI. The source line contact LI connects the semiconductor substrate 10 and the source line SL (not illustrated), which is provided higher than the NAND string 8. Furthermore, the locations of the source line contact LI and the NAND string 8 may be set differently. For example, a plurality of NAND strings 8 can be provided between two source line contacts LI. Moreover, while, in the example illustrated in FIG. 3, for ease of description, a case in which, in one string unit SU, a plurality of NAND strings 8 is arrayed in line along a second direction D2 perpendicular to the first direction D1 and parallel to the semiconductor substrate 10 is illustrated, the location of NAND strings 8 in one string unit SU may be set differently. For example, NAND strings 8 can be arranged in two parallel rows along the second direction D2, or can be arranged in four rows in a staggered manner.

In each string unit SU, the NAND string 8 is formed along a third direction D3 perpendicular to the semiconductor substrate 10. More specifically, an n-type well 11 is provided on the surface region of the semiconductor substrate 10. Then, a p-type well 12 is provided on the surface region of the n-type well 11. Moreover, $n^+$-type diffusion layers 13 are provided on the surface region of the p-type well 12. Then, above the p-type well 12, a wiring layer 14, which serves as the selection gate line SGS, ten wiring layers 15, which serve as the dummy word lines WLD and word lines WL, and a wiring layer 16, which serves as the selection gate line SGD, are sequentially stacked in layers via respective interlayer insulating films (not illustrated).

Then, a pillar-shaped semiconductor layer 17, which penetrates through the wiring layers 16, 15, and 14 and extends to the p-type well 12, is formed. A tunnel insulating film 18, a charge storage layer 19, and a block insulating film 20 are sequentially formed on the side surface of the semiconductor layer 17. The semiconductor layer 17 is made from, for example, polysilicon. The tunnel insulating film 18 and the block insulating film 20 are made from, for example, a silicon oxide film. The charge storage layer 19 is made from, for example, a silicon nitride film. Hereinafter, a pillar formed by the semiconductor layer 17, the tunnel insulating film 18, the charge storage layer 19, and the block insulating film 20 is referred to as a "memory pillar MP". The semiconductor layer 17 functions as a current pathway of the NAND string 8, and serves as a region in which channels of respective transistors are formed. Then, the upper end of the semiconductor layer 17 is connected to a wiring layer (not illustrated) serving as the bit line BL.

The memory cell transistors MT and the dummy memory cell transistors MTD are formed from the memory pillar MP and the wiring layers 15. Moreover, the select transistor ST1 is formed from the memory pillar MP and the wiring layer 16, and the select transistor ST2 is formed from the memory pillar MP and the wiring layer 14. Furthermore, in the example illustrated in FIG. 3, each of the wiring layer 14 and the wiring layer 16 is configured with a single layer, but can be configured with a plurality of layers.

The source line contact LI extends in the second direction D2. The source line contact LI is made from, for example, polysilicon. Then, the bottom surface of the source line contact LI is connected to the $n^+$-type diffusion layer 13, and the upper surface thereof is connected to a wiring layer (not illustrated) serving as the source line SL.

1.2 Read Operation 1.2.1 Overall Flow of Read Operation

First, the overall flow of the read operation is described with reference to FIG. 4. Hereinafter, in the present embodiment, for ease of description, a case in which data corresponding to one threshold voltage level is read out by a single read operation is described. Furthermore, in a case where the memory cell transistor MT retains multiple-valued (2-bit or more) data, data corresponding to a plurality of threshold voltage levels can be read out by a single read operation.

Figure 4:
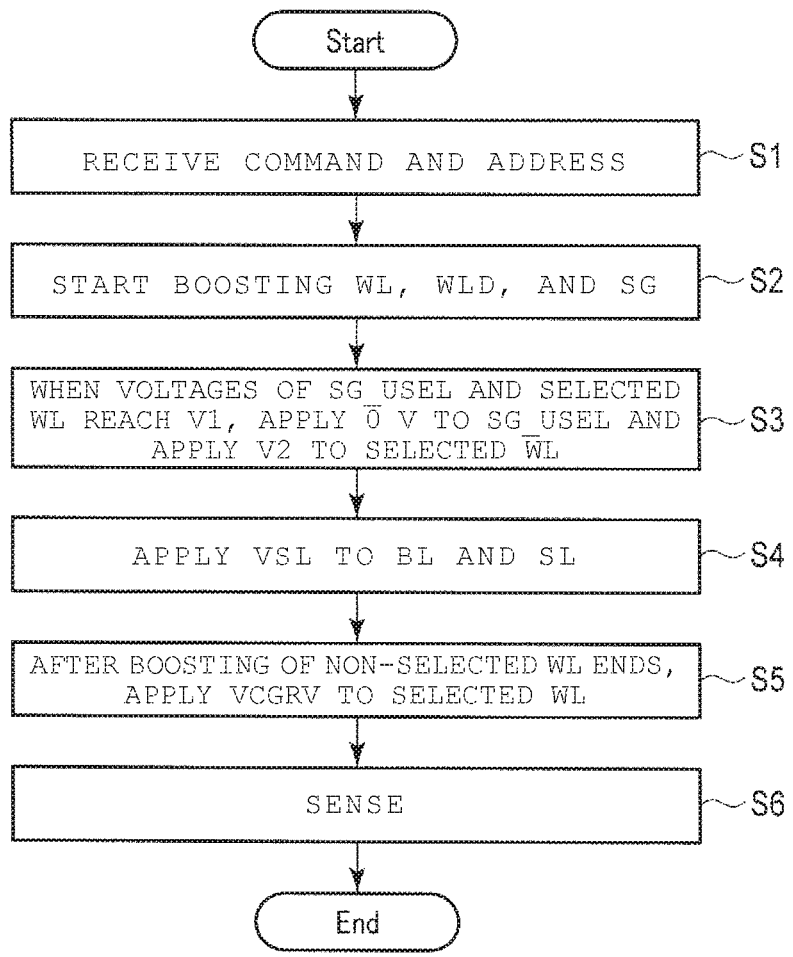
FIG. 4 is a flowchart illustrating the flow of a read operation in the semiconductor memory device according to the first embodiment.

As illustrated in FIG. 4, in step S1, the NAND-type flash memory 1 receives a read command and address information from an external controller (not illustrated). The control circuit 6 starts reading corresponding pages based on the command and the address information.

First, in step S2, the row decoder 3 starts applying voltages (boosting) to the word lines WL, the dummy word lines WLD, and the selection gate lines SG (SGD and SGS) in a corresponding block BLK. More specifically, the row decoder 3 raises the voltages of a non-selected word line WL and the dummy word line WLD to a voltage VREAD, and raises the voltage of a selection gate line SG corresponding to a selected string unit SU (hereinafter referred to as a "selection gate line SG_SEL") to a voltage VSG. Moreover, the row decoder 3 raises the voltages of a selected word line WL and a selection gate line SG corresponding to a non-selected string unit SU (hereinafter referred to as a "selection gate line SG_USEL") to a voltage V1.

The voltage VREAD is a voltage which is applied to the non-selected word line WL and the dummy word line WLD during a data read operation to turn on the corresponding memory cell transistor MT and dummy memory cell transistor MTD. The voltage VSG is a voltage which is applied to the selection gate line SG during a data read operation to turn on the corresponding select transistors ST1 and ST2.

The voltage V1 is a voltage lower than the voltage VREAD and the voltage VSG. Although details are described below, when a potential difference between the voltage VREAD and the voltage V1 becomes large, a difference in band potential becomes large between the transistors (the memory cell transistors MT, the dummy memory cell transistors MTD and the select transistors ST1 and ST2) included in the NAND string 8, so that a band-to-band tunneling current is generated (or increased). Therefore, the voltage V1 is set in such a way as to satisfy a relationship of "(VREAD−V1)<V_btbt", where V_btbt is the minimum potential difference according to which a band-to-band tunneling current is generated (increased) between adjacent transistors.

Furthermore, the potential difference V_btbt varies with, for example, structures of the transistors and locations of the adjacent transistors. When a band-to-band tunneling current is generated, a hot carrier occurs, so that electric charges are injected into a charge storage layer. Therefore, the threshold voltage of the memory cell transistor MT varies, and fail bits of the read operation increase. Accordingly, the potential difference V_btbt can be set as the minimum potential difference according to which fail bits increase depending on a potential difference of "VREAD−V1".

The sense amplifier 4 and the source line driver 5 apply a ground voltage VSS (for example, 0 V) to the bit line BL and the source line SL. In the following description, the present embodiment is described with respect to a case where the ground voltage VSS is 0 V. For that reason, when the voltages of the word line WL, the dummy word line WLD, and the selection gate line SG increase to voltages equal to or higher than the threshold voltages of the memory cell transistor MT, the dummy memory cell transistor MTD, and the select transistors ST1 and ST2, the memory cell transistor MT, the dummy memory cell transistor MTD, and the select transistors ST1 and ST2 are turned on. Accordingly, the potential of the channel of the memory pillar MP is set to 0 V, which is the same voltage as those of the bit line BL and the source line SL.

Next, in step S3, when the voltages of the selection gate line SG_USEL and the selected word line WL reach the voltage V1, the row decoder 3 applies 0 V to the selection gate line SG_USEL and applies a voltage V2 lower than the voltage V1 to the selected word line WL. The voltage V2 is a voltage which is set to decrease the voltage of the selected word line WL. For example, the voltage V2 can be a voltage which is used to turn off a corresponding memory cell transistor MT, or can be a voltage VCGRV which is applied to the selected word line WL in a next step. In the following description, the present embodiment is described with respect to a case where the memory cell transistor MT is turned off by the voltage V2 being applied. This causes the selected memory cell transistor MT and the select transistors ST1 and ST2 of the non-selected string unit SU to be turned off.

Next, in step S4, a voltage VSL is applied to the bit line BL and the source line SL. The voltage VSL is a voltage which is applied to the source line SL during a data read operation.

Next, in step S5, after the voltages of the non-selected word line WL and the dummy word line WLD reach the voltage VREAD, the row decoder 3 applies a voltage VCGRV to the selected word line WL. The voltage VCGRV is a voltage corresponding to a threshold voltage level of data targeted for reading. The voltage VCGRV and the voltage VREAD are in a relationship of "VCGRV<VREAD". For example, in a case where the threshold voltage of the memory cell transistor MT is equal to or higher than the voltage VCGRV, the memory cell transistor MT is turned off, and, in a case where the threshold voltage is lower than the voltage VCGRV, the memory cell transistor MT is turned on.

Next, in step S6, the sense amplifier 4 senses a current flowing through the bit line BL connected to the selected memory cell transistor MT, thus reading out data. More specifically, the sense amplifier 4 applies a voltage VBL to the bit line BL. The voltage VBL is a voltage higher than the voltage VSL. In a case where a memory cell transistor MT targeted for reading is in an off-state, no current flows from the bit line BL to the source line SL. On the other hand, a memory cell transistor MT targeted for reading is in an on-state, a current flows from bit line BL to the source line SL.

1.2.2 Voltages and Currents of Various Lines during Read Operation

Next, voltages and currents of various lines during a read operation are described with reference to FIG. 5.

First, voltages of various lines are described.

Figure 5:
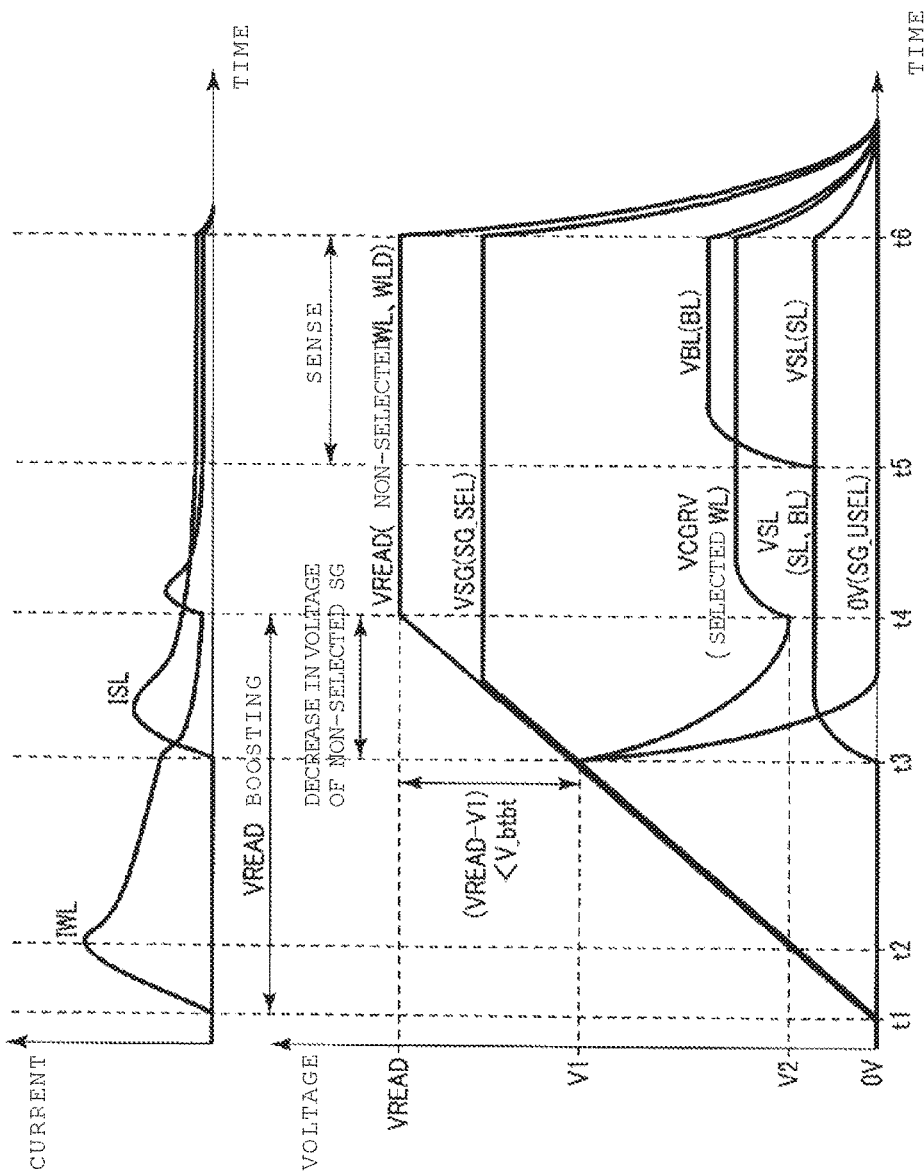
FIG. 5 is a timing chart illustrating voltages and currents of various wiring lines during the read operation in the semiconductor memory device according to the first embodiment.

As illustrated in FIG. 5, at time t1, the row decoder 3 starts applying voltages to the word line WL, the dummy word line WLD, and the selection gate line SG included in the selected block BLK. More specifically, the voltages of the non-selected word line WL and the dummy word line WLD are increased for a period from time t1 to time t4, and then reach the voltage VREAD at time t4 (hereinafter referred to as a "VREAD boosting period"). The voltages of the selected word line WL and the selection gate line SG_USEL are increased for a period from time t1 to time t3, and then reach the voltage V1 at time t3 (hereinafter referred to as a "V1 boosting period"). Moreover, the voltage of the selection gate line SG_SEL reaches the voltage VSG in a period from time t3 to time t4. Moreover, the sense amplifier 4 and the source line driver apply 0 V to the bit line BL and the source line SL. Furthermore, the voltages of the bit line BL and the source line SL are not limited to 0 V (ground voltage). For example, the voltages of the bit line BL and the source line SL only need to be a voltage lower than the voltage VSL. Setting the voltages of the bit line BL and the source line SL lower than the voltage VSL enables setting the potential of the channel of the memory pillar MP in the V1 boosting period lower than the voltage VSL. Moreover, while the example illustrated in FIG. 5 indicates a case where the boosting rates for the voltages VREAD, VSG, and V1 are the same, the boosting rates for those voltages can be different. In order to prevent a processing time of the read operation from becoming long, it is desirable that the V1 boosting period end within the VREAD boosting period.

At time t2, the voltages of the word line WL, the dummy word line WLD, and the selection gate line SG become higher than the threshold voltages of the memory cell transistor MT, the dummy memory cell transistor MTD, and the select transistors ST1 and ST2, so that the memory cell transistor MT, the dummy memory cell transistor MTD, and the select transistors ST1 and ST2 are turned on. With this, the potential of the channel of the memory pillar MP is set to 0 V, which is the same as the voltages of the bit line BL and the source line SL.

At time t3, when the voltages of the selected word line WL and the selection gate line SG_USEL reach the voltage V1, the row decoder 3 applies the voltage V2 to the selected word line WL, and applies 0 V to the selection gate line SG_USEL. With this, the voltages of the selected word line WL and the selection gate line SG_USEL decrease. In the non-selected string unit SU, the select transistors ST1 and ST2 are turned off. Therefore, the channel of a NAND string 8 in the non-selected string unit SU (hereinafter referred to as a "non-selected NAND string") enters a floating state.

On the other hand, the select transistors ST1 and ST2 in the selected string unit SU are kept in an on-state. Then, as the voltage VSL is applied to the bit line BL and the source line SL, the channel of a NAND string 8 in the selected string unit SU (hereinafter referred to as a "selected NAND string") increases to the voltage VSL, which is the same voltage as those of the bit line BL and the source line SL.

Furthermore, it is desirable that the timing at which the voltage VSL is applied to the bit line BL and the source line SL be after the select transistors ST1 and ST2 in the non-selected string unit SU are turned off. This enables preventing the channel potential of the non-selected NAND string 8 from increasing due to the voltage VSL of the bit line BL and the source line SL. Moreover, it is desirable that the voltage VSL be smaller than a voltage difference of "VREAD−V1" so as to reduce the variation (potential difference) of the channel potential occurring in the neighborhood of the select transistors ST1 and ST2.

At time t4, when the voltages of the non-selected word line WL and the dummy word line WLD reach the voltage VREAD, the row decoder 3 applies the voltage VCGRV to the selected word line WL. Furthermore, the row decoder 3 can apply the voltage VCGRV to the selected word line WL at time t3.

At time t5, the sense amplifier 4 applies the voltage VBL to the bit line BL, and performs sensing for a period from time t5 to time t6.

At time t6, when sensing ends, recovery processing is performed, so that 0 V is applied to the various lines. With this, the read operation ends.

Next, an example of currents flowing through the word line WL and the source line SL is described. In the present embodiment, since the timing at which to charge the word line WL is different from the timing at which to charge the source line SL, the peaks of consumption currents of the word line WL and the source line SL are different in timing.

As illustrated in FIG. 5, when the total current flowing through the word line WL and the dummy word line WLD is denoted by IWL, the current IWL becomes peak (maximum) in a period from time t2 to time t3. More specifically, in a period from time t1 to time t2, in the NAND string 8 of each string unit SU, the select transistors ST1 and ST2 may be in an off-state. In this case, the NAND string 8 is in a floating state. Therefore, when the word line WL and the dummy word line WLD are charged, the current IWL is almost not affected by the parasitic capacitance existing with respect to the channel of the memory cell transistor MT. In other words, since the charging capacities of the word line WL and the dummy word line WLD are small, the current IWL is relatively small.

In a period from time t2 to time t3, each transistor in the selected and non-selected string units SU is in an on-state, and the channel of the NAND string 8 is in a conducting state. Therefore, the charging capacities of the word line WL and the dummy word line WLD are made large by being affected by the parasitic capacitance existing with respect to the channel of the memory cell transistor MT, so that the current IWL increases.

In a period from time t3 to time t4, since the NAND string 8 in the non-selected string unit SU is brought into a floating state, the charging capacity decreases, so that the current IWL decreases.

In a period from time t4 to time t5, while the current IWL increases due to charging of the voltage VCGRV to the selected word line WL, the peak thereof is smaller than that in the period from time t2 to time t3.

On the other hand, a current ISL which flows through the source line SL becomes peak in a period from time t3, which is the time at which to start charging the source line SL, to time t4.

Figure 6:
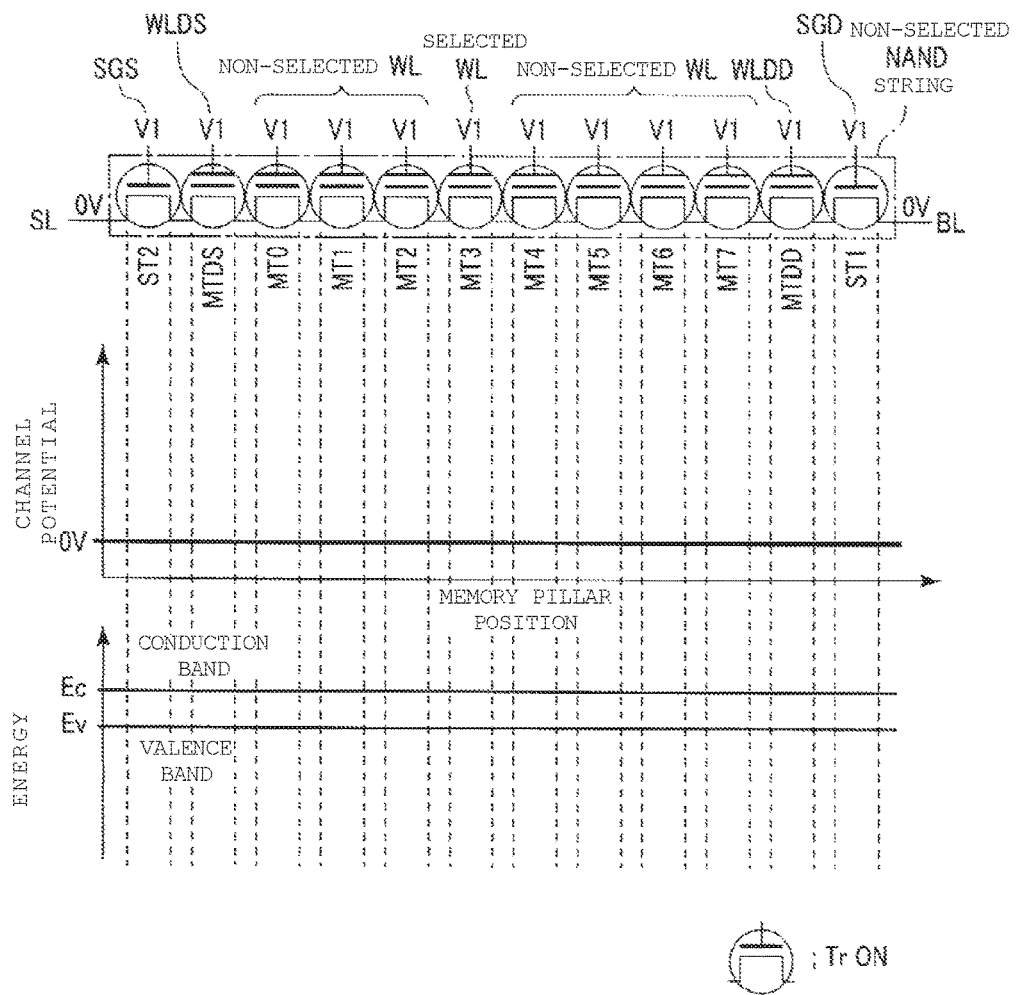
FIG. 6 is a diagram illustrating a channel potential and bands of a non-selected NAND string during the read operation in the semiconductor memory device according to the first embodiment.
Figure 7:
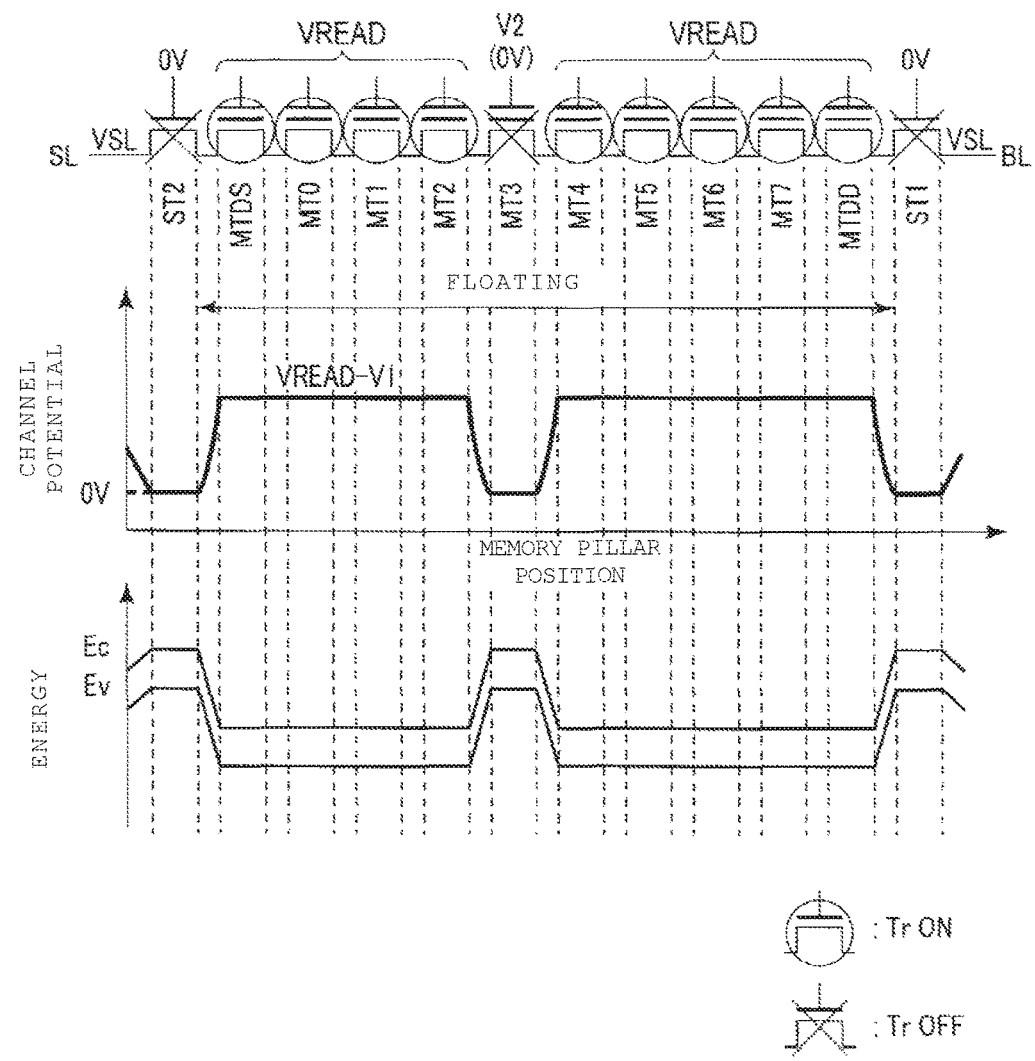
FIG. 7 is a diagram illustrating a channel potential and bands of the non-selected NAND string during the read operation in the semiconductor memory device according to the first embodiment.

1.2.3 Channel Potential of Non-Selected NAND String and State of Each Transistor During Read Operation Next, the channel potential of the non-selected NAND string 8 and the state of each transistor during a read operation are described with reference to FIGS. 6 and 7. FIGS. 6 and 7 illustrate the channel potential and bands (in particular, energy bands) of the non-selected NAND string 8 at time t3 and time t4, respectively, illustrated in FIG. 5. Furthermore, the examples illustrated in FIGS. 6 and 7 indicate a case where the memory cell transistor MT3 is selected in the selected string unit SU. In other words, the word line WL3 is selected, and the word lines WL0 to WL2 and WL4 to WL7 are not selected. Furthermore, for ease of description, in FIG. 7, the voltage V2 is set to 0 V.

As illustrated in FIG. 6, the voltage V1 is applied to the gate of each transistor in the non-selected NAND string 8, and 0 V is applied to the source line SL and the bit line BL. In this case, each transistor in the non-selected NAND string is turned on, and the channel potential is set to 0 V irrespective of positions in the memory pillar MP. In this case, the potentials of the conduction band Ec and the valence band Ev of each transistor are almost the same.

As illustrated in FIG. 7, 0 V is applied to the selection gate line SG in the non-selected NAND string 8, so that the select transistors ST1 and ST2 are turned off. Since the select transistors ST1 and ST2 are in an off-state, the non-selected NAND string 8 is brought into a floating state. In this state, the voltage VSL is applied to the bit line BL and the source line SL. Moreover, the voltages of the non-selected word lines WL (WL0 to WL2 and WL4 to WL7) and the dummy word lines WLD (WLDD and WLDS) increase from the voltage V1 to the voltage VREAD, and 0 V is applied to the selected word line WL. Then, immediately below the non-selected memory cell transistors MT (MT0 to MT2 and MT4 to MT7) and the dummy memory cell transistors MTD (MTDD and MTDS), the channel potential rises as much as a voltage difference of "VREAD−V1" due to capacitive coupling. Moreover, according to the rise of the channel potential, the potentials of the conduction band Ec and the valence band Ev decrease. Therefore, the bands fluctuate between the non-selected memory cell transistors MT2 and MT4, which are adjacent to the selected memory cell transistor MT3, between the select transistor ST1 and the dummy memory cell transistor MTDD, and between the select transistor ST2 and the dummy memory cell transistor MTDS. However, since the relationship of "(VREAD−V1) <V_btbt" is satisfied, almost no band-to-band tunneling current flows.

1.3 Advantageous Effects According to Present Embodiment

The configuration according to the present embodiment enables improving processing capacity. Hereinafter, advantageous effects according to the present embodiment are described in detail.

It is known that when the voltages of the non-selected word line WL and the dummy word line WLD are increased to the voltage VREAD with the select transistors ST1 and ST2 of the non-selected NAND string 8 turned off during a read operation, the channel potential difference in the non-selected NAND string 8 becomes large due to capacitive coupling. In this case, a band-to-band tunneling current becomes likely to occur between adjacent transistors having a large channel potential difference.

Figure 8:
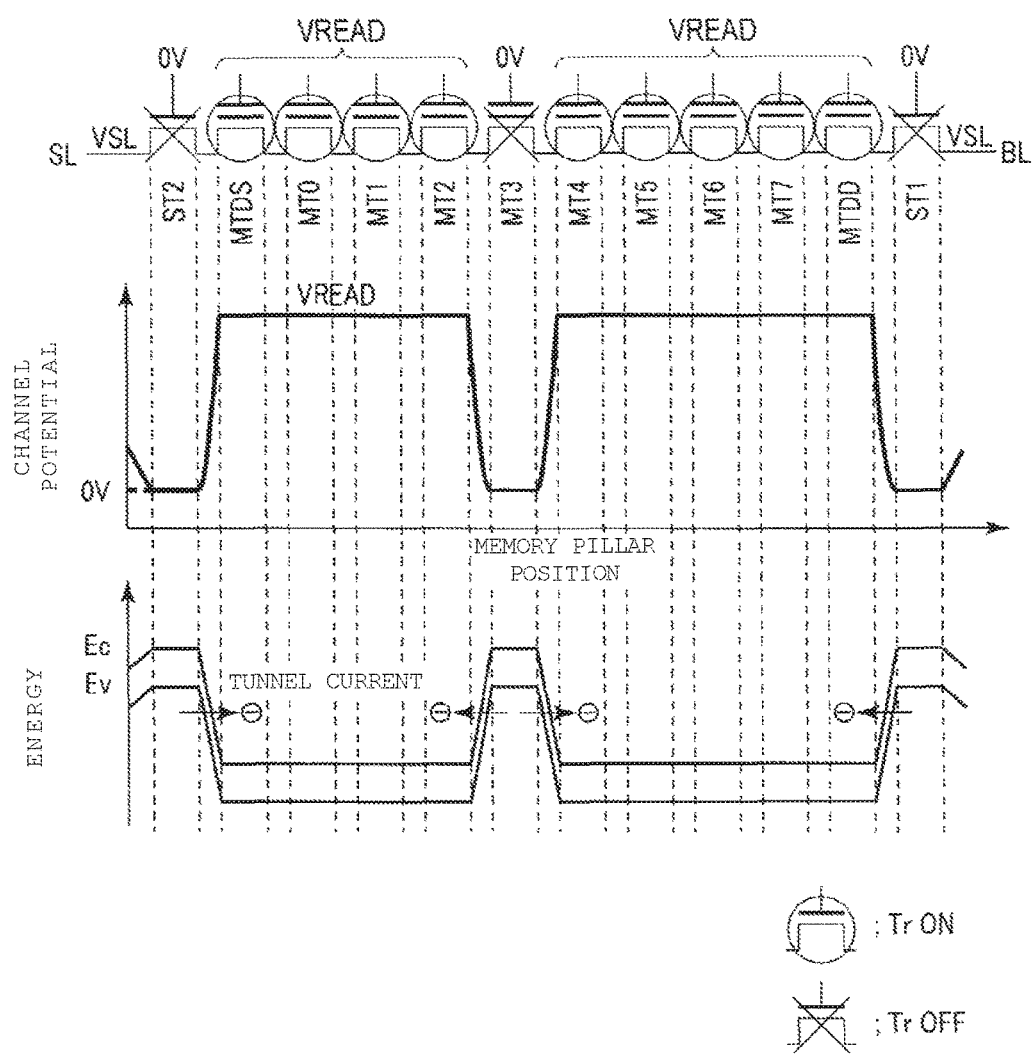
FIG. 8 is a diagram illustrating a channel potential and bands of the non-selected NAND string in a case where voltages of a non-selected word line and a dummy word line are increased with select transistors turned off during the read operation.

Such an example is illustrated in FIG. 8. FIG. 8 illustrates the channel potential and bands of the non-selected NAND string 8 in a case where the voltages of the non-selected word line WL and the dummy word line WLD are increased from 0 V to the voltage VREAD with 0 V applied to the selection gate line SG and the selected word line WL and the voltage VSL applied to the bit line BL and the source line SL. The example illustrated in FIG. 8, as in FIGS. 6 and 7, indicates a case where the memory cell transistor MT3, i.e., the word line WL3, is selected in the selected string unit SU.

As illustrated in FIG. 8, immediately below the non-selected memory cell transistors MT (MT0 to MT2 and MT4 to MT7) and the dummy memory cell transistors MTD (MTDD and MTDS), the channel potential rises to the voltage VREAD due to capacitive coupling. Moreover, according to the rise of the channel potential, the potentials of the conduction band Ec and the valence band Ev decrease. Therefore, the bands fluctuate between the non-selected memory cell transistors MT2 and MT4, which are adjacent to the selected memory cell transistor MT3, between the select transistor ST1 and the dummy memory cell transistor MTDD, and between the select transistor ST2 and the dummy memory cell transistor MTDS, so that a band-to-band tunneling current becomes likely to flow. With this, the threshold voltages of the memory cell transistors MT2 and MT4 and the dummy memory cell transistors MTDD and MTDS vary, and fail bits increase.

A method called "VREAD spike" is known as one of methods for preventing a band-to-band tunneling current. In VREAD spike, after the voltages of the word line WL and the dummy word line WLD are increased to the voltage VREAD with the channel of the non-selected NAND string 8 in a conducting state, the select transistors ST1 and ST2 in the non-selected NAND string 8 are turned off.

More specifically, for example, the voltages of the word line WL and the dummy word line WLD in the selected block BLK are increased to the voltage VREAD with the voltage VSL applied to the bit line BL and the source line SL, and the voltage of the selection gate line SG is increased to the voltage VSG. With this, the memory cell transistor MT, the dummy memory cell transistor MTD, and the select transistors ST1 and ST2 in the selected block BLK are turned on, so that the channel potential of the NAND string 8 in the selected block BLK homogeneously rises to the voltage VSL. Then, after the voltages of the word line WL and the dummy word line WLD reach the voltage VREAD, a voltage that turns off the select transistors ST1 and ST2, e.g., 0 V, is applied to the selection gate line SG_USEL, and the select transistors ST1 and ST2 in the non-selected NAND string 8 are turned off. Moreover, the voltage VCGRV is applied to the selected word line WL.

This enables preventing an increase of the channel potential of the non-selected NAND string 8 and a variation of the channel potential in the NAND string 8. However, in this case, in the non-selected NAND string 8, after the channel is charged to the voltage VSL, 0 V is applied to the selection gate line SG_USEL. Therefore, the channel potential immediately below the select transistors ST1 and ST2 becomes a value determined by a voltage transition of the voltage VSL and the voltage VSG, so that a variation caused by the voltage VSL occurs in the channel potential. Accordingly, the voltage VSL is required to be set to such a voltage as not to cause a band-to-band tunnel current.

Moreover, in a case where 0 V is applied to the selection gate line SG_USEL before the voltages of the non-selected word line WL and the dummy word line WLD reach the voltage VREAD, when a voltage that is first applied to the selection gate line SG_USEL is denoted by VX, it is necessary to satisfy a condition of "V_btbt>(VREAD−(VX−VSL))" with respect to a potential difference V_btbt which causes a band-to-band tunnel current. In other words, due to a channel potential difference which depends on the voltage VSL, it is impossible to set the voltage VX sufficiently lower than the voltage VREAD.

Furthermore, in a case where, after all of the word lines WL are once charged up to the voltage VREAD, 0 V is applied to the selection gate line SG_USEL and the voltage VCGRV is applied to the selected word line WL, the processing time of a read operation becomes long. Moreover, since the word lines WL are charged with each transistor of the selected and non-selected NAND strings 8 turned on, the charging capacity becomes large. Therefore, current consumption (and power consumption) increases, and the charging time tends to become long.

In contrast to this, in the configuration according to the present embodiment, charging of the word line WL, the dummy word line WLD, and the selection gate line SG in the selected block BLK is started with 0 V (ground voltage VSS) applied to the bit line BL and the source line SL in the read operation. Then, when the voltages of the selection gate line SG_USEL and the selected word line WL reach the voltage V1 before the voltages of the non-selected word line WL and the dummy word line WLD reach the voltage VREAD (within the VREAD boosting period), the voltages of the selection gate line SG_USEL and the selected word line WL are decreased. Moreover, after the voltage of the selection gate line SG_USEL decreases and the select transistors ST1 and ST2 of the non-selected NAND string 8 are turned off, the voltage VSL is applied to the source line SL and the bit line BL. Therefore, since the select transistors ST1 and ST2 of the non-selected NAND string 8 can be turned off within the VREAD boosting period, a delay in the processing time, which would be caused by the voltages of the selection gate line SG_USEL and the selected word line WL being increased to the voltage V1, can be prevented. Accordingly, the processing capacity of a semiconductor memory device can be improved.

Furthermore, in the configuration according to the present embodiment, an increase in the band-to-band tunnel current caused by the channel potential difference in the non-selected NAND string 8 can be prevented. Accordingly, an increase in fail bits can be prevented, and the reliability of a semiconductor memory device can be improved.

Moreover, in the configuration according to the present embodiment, during a period in which the voltages of the selection gate line SG_USEL and the selected word line WL are being increased to the voltage V1, the voltages of the bit line BL and the source line SL are set to, for example, 0 V. Alternatively, the voltages of the bit line BL and the source line SL can be set to a voltage lower than the voltage VSL. Then, after the select transistors ST1 and ST2 of the non-selected NAND string 8 are turned off, the voltage VSL is applied to the bit line BL and the source line SL. This enables preventing the channel of the non-selected NAND string 8 from being charged with the voltage VSL. Accordingly, since the voltage VSL is not included in the voltage difference of "VREAD−V1", the voltage V1 can be set to a lower voltage. In other words, the time in which the voltages of the selection gate line SG_USEL and the selected word line WL reach the voltage V1 can be made shorter. Accordingly, the processing capacity of a semiconductor memory device can be improved.

Additionally, in the configuration according to the present embodiment, since the timing at which to start charging of the word line WL and the dummy word line WLD and the timing at which to start charging of the source line SL and the bit line BL are different from each other, peaks of currents supplied to the memory cell array are dispersed, so that the maximum level of current consumption can be reduced.

Furthermore, in the configuration according to the present embodiment, since the select transistors ST1 and ST2 of the non-selected NAND string 8 are turned off before the voltages of the non-selected word line WL and the dummy word line WLD reach the voltage VREAD, the influence of the parasitic capacitances of the memory cell transistor MT and the dummy memory cell transistor MTD in the non-selected NAND string 8 can be reduced. Accordingly, the charging capacity occurring when the non-selected word line WL and the dummy word line WLD are charged can be reduced, and an increase in power consumption can be prevented.

2. Second Embodiment

Next, a second embodiment is described. In the second embodiment, a case where the voltage VREAD, which is applied to the non-selected word line WL and the dummy word line WLD during a read operation, is increased in two steps is described. Hereinafter, only portions different from those of the first embodiment are described.

2.1 Voltages of Various Lines During Read Operation

Voltages of various lines during a read operation are described with reference to FIG. 9. In the example illustrated in FIG. 9, the currents IWL and ISL illustrated in FIG. 5 in the first embodiment are omitted from illustration.

Figure 9:
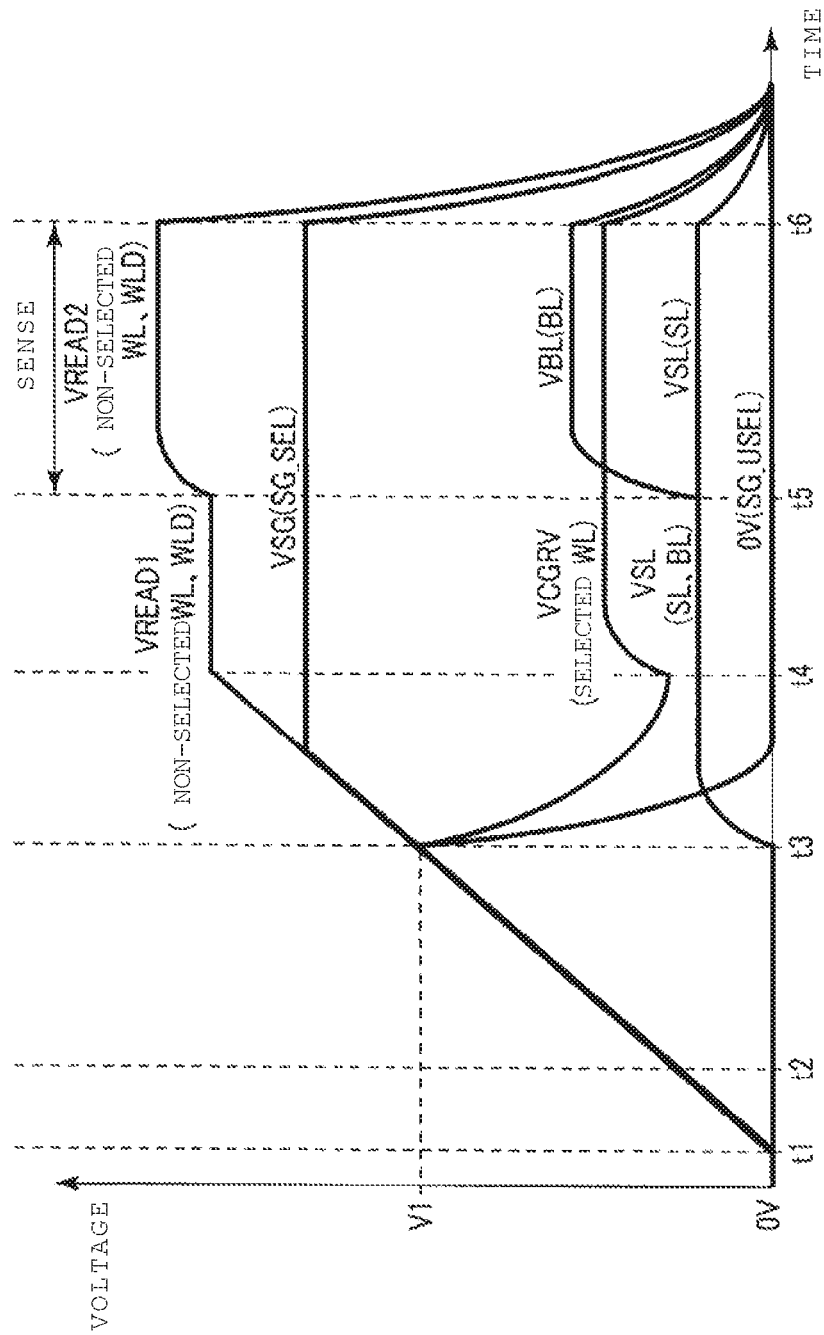
FIG. 9 is a timing chart illustrating voltages of various wiring lines during a read operation in a semiconductor memory device according to a second embodiment.

As illustrated in FIG. 9, in a period from time t1 to time t6, the voltages of the bit line BL, the source line SL, the selected word line WL, and the selection gate lines SG_SEL and SG_USEL are the same as those illustrated in FIG. 5 in the first embodiment. Hereinafter, only the voltages of the non-selected word line WL and the dummy word line WLD are described.

The voltages of the non-selected word line WL and the dummy word line WLD are increased for a period from time t1 to time t4, and then reach a voltage VREAD1 at time t4. The voltage VREAD1 is a voltage which is applied to the non-selected word line WL and the dummy word line WLD for a period other than the sense period (a period from time t5 to time t6) and is used to turn on the corresponding memory cell transistor MT and the dummy memory cell transistor MTD.

At time t5, the row decoder 3 applies a voltage VREAD2 to the non-selected word line WL and the dummy word line WLD. The voltage VREAD2 is a voltage which is applied to the non-selected word line WL and the dummy word line WLD for the sense period, and is in a relationship of "VREAD1<VREAD2". The voltage VREAD in the first embodiment corresponds to the voltage VREAD2 in the present embodiment.

2.2 Advantageous Effects of Present Embodiment

In the configuration according to the present embodiment, similar advantageous effects to those of the first embodiment can be obtained.

Furthermore, in the configuration according to the present embodiment, in a period other than the sense period, the voltage VREAD1, which is lower than the voltage VREAD2 required for the sense period, is applied to the non-selected word line WL and the dummy word line WLD. This enables shortening the boosting period (a period from time t1 to t4 in FIG. 9) of the non-selected word line WL and the dummy word line WLD. Accordingly, the processing capacity of a semiconductor memory device can be improved.

Moreover, in the configuration according to the present embodiment, applying the voltage VREAD1 to the non-selected word line WL and the dummy word line WLD for a period other than the sense time enables reducing power consumption.

3. Modification Example

A semiconductor memory device according to the above-described embodiment includes a first memory string including first and second select transistors and first and second memory cell transistors connected between the first and second select transistors, a second memory string including third and fourth select transistors and third and fourth memory cell transistors connected between the third and fourth select transistors, a first word line connected to gates of the first and third memory cell transistors, a second word line connected to gates of the second and fourth memory cell transistors, first to fourth selection gate lines respectively connected to gates of the first to fourth select transistors, a bit line connected to the first and third select transistors, and a source line connected to the second and fourth select transistors. In a case where data stored in the first memory cell transistor is read out, during a period (from time t1 to time t4 in FIG. 5) in which the second word line (non-selected word line WL) is boosted from a first voltage (0 V) to a second voltage (VREAD), the first and second selection gate lines (SG_SEL) are boosted from the first voltage (0 V) to a third voltage (VSG), after the first word line (selected word line WL) is boosted from the first voltage to a fourth voltage (V1) lower than the second and third voltages, a fifth voltage lower than the fourth voltage is applied to the first word line, after the third and fourth selection gate lines (SG_USEL) are boosted from the first voltage to the fourth voltage, the first voltage is applied to the third and fourth selection gate lines, a sixth voltage (0 V) is applied to the bit line and the source line during a period in which the first word line and the third and fourth selection gate lines are boosted to the fourth voltage, and, after the first word line and the third and fourth selection gate lines are boosted to the fourth voltage, the bit line and the source line are boosted from the sixth voltage to a seventh voltage (VSL).

Applying the above-described embodiment enables providing a semiconductor memory device capable of improving processing capacity.

Furthermore, embodiments are not limited to the above-described embodiment, but various modification can be implemented.

For example, the above-described embodiment is applicable to a planar NAND-type flash memory in which memory cell transistors MT are two-dimensionally arranged on a semiconductor substrate.

Furthermore, the term "connection" in the above-described embodiment includes a state in which things are indirectly interconnected through the intervention of something, such as a transistor or a resistor, therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Furthermore, various embodiments can be implemented as described below. For example, the memory cell transistor MT is able to store 2-bit (four-valued) data, and, when threshold voltage levels used to store any one of four values are defined as level E (erase level), level A, level B, and level C in the order of lowest to highest, (1) in a read operation, a voltage which is applied to a word line selected for the read operation of level A is, for example, between 0 V and 0.55 V inclusive. The voltage is not limited to this range, but can be between 0.1 V and 0.24 V inclusive, between 0.21 V and 0.31 V inclusive, between 0.31 V and 0.4 V inclusive, between 0.4 V and 0.5 V inclusive, or between 0.5 V and 0.55 V inclusive.

A voltage which is applied to a word line selected for the read operation of level B is, for example, between 1.5 V and 2.3 V inclusive. The voltage is not limited to this range, but can be between 1.65 V and 1.8 V inclusive, between 1.8 V and 1.95 V inclusive, between 1.95 V and 2.1 V inclusive, or between 2.1 V and 2.3 V inclusive.

A voltage which is applied to a word line selected for the read operation of level C is, for example, between 3.0 V and 4.0 V inclusive. The voltage is not limited to this range, but can be between 3.0 V and 3.2 V inclusive, between 3.2 V and 3.4 V inclusive, between 3.4 V and 3.5 V inclusive, between 3.5 V and 3.6 V inclusive, or between 3.6 V and 4.0 V inclusive.

The time of the read operation (tR) can be, for example, between 25 μs and 38 μs inclusive, between 38 μs and 70 μs inclusive, or between 70 μs and 80 μs inclusive.

(2) The write operation includes a program operation and a verification operation as mentioned above. In the write operation, a voltage which is first applied to a word line selected for the program operation is, for example, between 13.7 V and 14.3 V inclusive. The voltage is not limited to this range, but can be, for example, between 13.7 V and 14.0 V inclusive or between 14.0 V and 14.6 V inclusive.

A voltage which is applied to a word line selected for writing to an odd-numbered word line and a voltage which is applied to a word line selected for writing to an even-numbered word line can be made different from each other.

When the program operation is assumed to employ an incremental step pulse program (ISPP) system, examples of a step-up voltage include about 0.5 V.

A voltage which is applied to a non-selected word line can be, for example, between 6.0 V and 7.3 V inclusive. The voltage is not limited to this range, but can be, for example, between 7.3 V and 8.4 V inclusive, or can be equal to or lower than 6.0 V.

A pass voltage to be applied can be changed depending on whether the non-selected word line is an odd-numbered word line or an even-numbered word line.

The time of the write operation (tProg) can be, for example, between 1700 μs and 1800 μs inclusive, between 1800 μs and 1900 μs inclusive, or between 1900 μs and 2000 μs inclusive.

(3) In an erase operation, a voltage which is first applied to a well formed on an upper portion of a semiconductor substrate and having the memory cells arranged above can be, for example, between 12 V and 13.6 V inclusive. The voltage is not limited to this range, but can be, for example, between 13.6 V and 14.8 V inclusive, between 14.8 V and 19.0 V inclusive, between 19.0 V and 19.8 V inclusive, or between 19.8 V and 21 V inclusive.

The time of the erase operation (tErase) can be, for example, between 3000 μs and 4000 μs inclusive, between 4000 μs and 5000 μs inclusive, or between 4000 μs and 9000 μs inclusive.

(4) The structure of the memory cells has a charge storage layer arranged on a semiconductor substrate (a silicon substrate) via a tunnel insulating film with a film thickness of 4 nm to 10 nm. The charge storage layer can have a stacked structure configured with an insulating film with a film thickness of 2 nm to 3 nm made from, for example, SiN or SiON and polysilicon with a film thickness of 3 nm to 8 nm. Moreover, a metal such as Ru can be added to poly-silicon. An insulating film is provided on the charge storage layer. The insulating film includes, for example, a silicon oxide film with a film thickness of 4 nm to 10 nm sandwiched between a lower-layer High-k film with a film thickness of 3 nm to 10 nm and an upper-layer High-k film with a film thickness of 3 nm to 10 nm. Examples of the High-k film include HfO. Furthermore, the film thickness of the silicon oxide film can be made greater than the film thickness of the High-k film. A control electrode with a film thickness of 30 nm to 70 nm is formed on the insulating film via a material with a film thickness of 3 nm to 10 nm. In this example, this material is a metal oxide film such as TaO or a metal nitride film such as TaN. The control electrode can be made from, for example, W (tungsten).

Moreover, an air gap can be formed between the memory cells.

What is claimed is:

1. A semiconductor memory device comprising:
a first memory string including first and second select transistors and first and second memory cell transistors connected between the first and second select transistors;
a second memory string including third and fourth select transistors and third and fourth memory cell transistors connected between the third and fourth select transistors;
a first word line connected to gates of the first and third memory cell transistors;
a second word line connected to gates of the second and fourth memory cell transistors;
first and second selection gate lines respectively connected to gates of the first and third select transistors;
a bit line connected to the first and third select transistors; and
a source line connected to the second and fourth select transistors,
wherein, during a read operation performed on the first memory cell transistor,
the second word line is boosted from a first voltage to a second voltage over a first time interval starting at a first point in time,
the first selection gate line is boosted from the first voltage to a third voltage, which is lower than the second voltage, over a second time interval, which is shorter than the first time interval, starting at the first point in time,
the first word line is boosted from the first voltage to a fourth voltage, which is lower than the third voltage, over a third time interval, which is shorter than the second time interval, starting at the first point in time, and then a fifth voltage lower than the fourth voltage is applied to the first word line,
the second selection gate line is boosted from the first voltage to the fourth voltage over the third time interval starting at the first point in time, and then the first voltage is applied to the second selection gate line, and
the bit line and the source line are maintained at a sixth voltage, which is lower than the fifth voltage, during the third time interval, and then, after the end of the third time interval, the bit line and the source line are boosted from the sixth voltage to a seventh voltage.

2. The semiconductor memory device according to claim 1, wherein the rate of boosting the voltages of the second word line, the first selection gate line, the first word line, and the second selection gate line, is the same.

3. The semiconductor memory device according to claim 1, wherein the voltage applied to the second selection gate line is decreased toward the first voltage at the end of the third time interval.

4. The semiconductor memory device according to claim 1, further comprising:
a third selection gate line connected to a gate of the second select transistor,
wherein the third selection gate line is boosted from the first voltage to the third voltage over the second time interval starting at the first point in time.

5. The semiconductor memory device according to claim 4, wherein the rate of boosting the voltages of the second word line, the first and third selection gate lines, the first word line, and the second selection gate line, is the same.

6. The semiconductor memory device according to claim 4, further comprising:
a fourth selection gate line connected to a gate of the fourth select transistor,
wherein the fourth selection gate line is boosted from the first voltage to the fourth voltage over the third time interval starting at the first point in time, and then the first voltage is applied to the fourth selection gate line.

7. The semiconductor memory device according to claim 6, wherein the rate of boosting the voltages of the second word line, the first and third selection gate lines, the first word line, and the second and fourth selection gate lines, is the same.

8. The semiconductor memory device according to claim 6, wherein the voltages applied to the second and fourth selection gate lines are decreased toward the first voltage at the end of the third time interval.

9. The semiconductor memory device according to claim 1, wherein the voltage applied to the first word line is set to the fifth voltage at the end of the first time interval.

10. The semiconductor memory device according to claim 9, wherein the voltage applied to the first word line is decreased toward an eighth voltage lower than the fifth voltage at the end of the third time interval.

11. The semiconductor memory device according to claim 10, wherein a ninth voltage higher than the eighth voltage is applied to the bit line after the eighth voltage is applied to the first word line, and data stored in the first memory cell transistor is read out according to a current flowing from the bit line to the source line.

12. The semiconductor memory device according to claim 11, wherein at the time the ninth voltage is applied to the bit line, the second word line is boosted to a voltage higher than the second voltage.

13. The semiconductor memory device according to claim 11, wherein the ninth voltage is higher than the seventh voltage.

14. The semiconductor memory device according to claim 1, wherein each of the first and sixth voltages is a ground voltage.

15. The semiconductor memory device according to claim 1, wherein a difference between the sixth voltage and the seventh voltage is smaller than a difference between the second voltage and the fourth voltage.

16. The semiconductor memory device according to claim 1, wherein the seventh voltage is applied to the bit line and the source line after the third and fourth select transistors are turned off during the read operation.

\* \* \* \* \*